United States Patent [19]

Milkovic

[11] 4,198,595

[45] Apr. 15, 1980

[54] APPARATUS AND METHOD OF PHASE SHIFT COMPENSATION OF AN ACTIVE TERMINATED CURRENT TRANSFORMER

[75] Inventor: Miran Milkovic, Scotia, N.Y.

[73] Assignee: General Electric Company, Somersworth, N.H.

[21] Appl. No.: 939,447

[22] Filed: Sep. 5, 1978

[51] Int. Cl.² ............................................. G01R 19/00
[52] U.S. Cl. ................................. 323/6; 324/123 R; 324/127
[58] Field of Search ................... 323/6, 50, 108–110, 323/120, 121, 128; 324/123, 127; 330/103, 107, 294

[56] References Cited

U.S. PATENT DOCUMENTS

| | | | |
|---|---|---|---|
| 3,639,824 | 2/1972 | Malavasi | 330/103 |
| 3,652,934 | 3/1972 | Paluug et al. | 324/123 R X |
| 3,760,198 | 9/1973 | Mori et al. | 330/107 X |
| 3,815,012 | 6/1974 | Milkovic | 323/6 |
| 3,815,013 | 6/1974 | Milkovic | 323/6 |
| 3,908,173 | 9/1975 | Murdock | 330/103 X |
| 3,919,648 | 11/1975 | Uetrecht | 330/107 X |
| 4,087,737 | 5/1978 | DeGennaro | 323/122 X |
| 4,103,231 | 7/1978 | Nemcek, Sr. | 324/123 R |

*Primary Examiner*—William M. Shoop
*Attorney, Agent, or Firm*—Robert E. Brunson; Francis X. Doyle

[57] ABSTRACT

Apparatus and method of compensating for a shift in the phase of the current applied to a current transformer terminated in a low impedance operational amplifier. The operational amplifier phase response is altered to minimize the phase angle between the transformer current and the amplifier output voltage to thus provide an output voltage directly proportional to the transformer current.

12 Claims, 2 Drawing Figures

4,198,595

APPARATUS AND METHOD OF PHASE SHIFT COMPENSATION OF AN ACTIVE TERMINATED CURRENT TRANSFORMER

BACKGROUND OF THE INVENTION

The present invention relates generally to a current transformer which is terminated in an active load having virtual short circuited input for developing an output voltage from the load which is proportional to the current in the transformer and, in particular, to an improved apparatus and method of altering, in the load, the phase angle of the output voltage relative to the transformer current by compensating for the phase shift in the transformer current.

In U.S. Pat. No. 3,815,012 to Miran Milkovic, the inventor of the present invention, and assigned to the assignee of the present invention, there is disclosed a circuit having a current transformer terminated in an operational amplifier or active load for providing phase angle alteration of the transformer current to produce an output voltage from the operational amplifier which is proportional to current in the transformer. In that patent, passive circuit elements (eq, resistors and capacitors) are connected between the output terminal and an inverting input terminal of an operational amplifier for effecting a shift in the phase angle between the transformer current and the output voltage produced by the amplifier in response to current in the transformer secondary winding.

While the circuit disclosed in the aforementioned U.S. Pat. No. 3,815,012 patent functions very well, it suffers from a competitive economic standpoint because of its need of the aforementioned passive circuit elements. Thus, a need exists for an active terminated current transformer circuit capable of phase shift compensation of current in the transformer which provides that compensation in a more economical and straight forward fashion.

SUMMARY OF THE INVENTION

Briefly, in accordance with one embodiment of the invention, a small current transformer having primary and secondary windings operates with its secondary winding terminated into a virtually zero ohm impedance of a transresistance or operational amplifier which employes a negative feedback loop. An alternating current is applied to the primary winding of the tranformer to effect an output voltage from the operational amplifier which is directly proportional to either the primary or secondary current of the current transformer. The invention utilizes a small phase shift element, such as a capacitor, connected across the frequency compensation terminals of an operational amplifier. A phase shift of up to several degrees in the transformer current can be compensated for utilizing the present apparatus and method.

In a second embodiment of the invention, the output voltage of the operational amplifier is current amplified to increase the dynamic range of the transformer current by increasing the current drive capabilities of the operational amplifier.

It is therefore an object of the present invention to provide an improved apparatus and method of phase shift compensation of an active terminated current transformer having enhanced phase shift compensation capabilities.

It is another object of the present invention to provide a current transformer terminated in a virtual zero ohm impedance active load which provides the capability of compensating for a phase shift of current in the transformer up to several degrees to generate an output voltage directly proportional to the transformer current.

A still further object of the present invention is to provide a current transformer terminated in a low input impedance operational amplifier capable of compensating for a phase shift in the current in the transformer to develop an output voltage directly proportional to the transformer current.

Yet another object of the present invention is to provide a current transformer terminated in a phase shift compensated amplifier which feeds a current amplifier to derive an output voltage directly proportional to current in the transformer.

The invention which is sought to be protected will be particularly pointed out and distinctly claimed in the claims appended hereto. However, it is believed that this invention and the manner in which its objects and advantages are obtained as well as other objects and advantages thereof will be more fully understood by reference to the following detailed description of the preferred embodiments, particularly when considered with the accompanying drawings.

DESCRIPTION OF THE PREFERRED EMBODIMENTS

Figure 1:
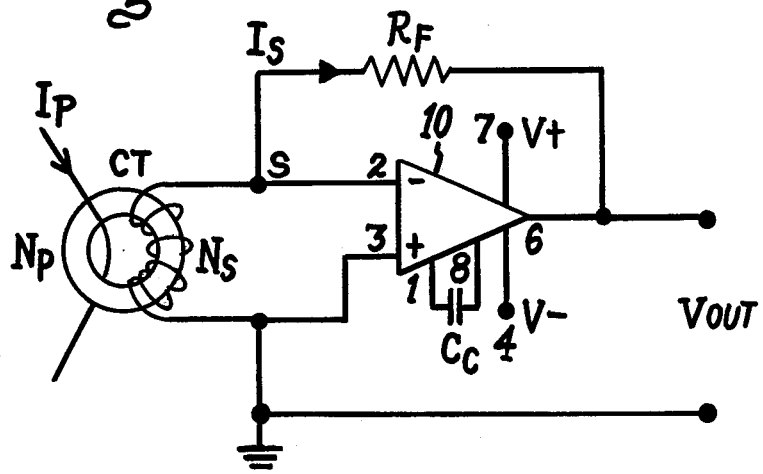
FIG. 1 is a schematic illustration of one embodiment of the invention showing a current transformer terminated in an operational amplifier.

In the ensuing description, like elements are designated by the same reference character or nomenclature in the drawing figures.

Referring initially to FIG. 1, there is shown a current transformer CT, illustrated as a toroidal core transformer having a single wire primary winding having NP turns and a secondary winding having NS turns. While the transformer illustrated utilizes a single primary toroidal winding, it is to be understood that other types of current transformers having more than one turn on the primary winding may also be utilized. As shown in FIG. 1, the primary winding conducts an alternating current $I_P$ which is provided to the transformer CT from a current source not shown. Through transformer action, the primary current IP is inductively coupled into the secondary winding to generate a secondary current IS.

An operational amplifier 10 is provided for generating an output voltage designated $V_{out}$ directly proportional to current in the transformer CT. As shown, the operational amplifier 10 is provided with an inverting input terminal designated by a minus sign (−) and a non inverting input terminal designated by a plus sign (+). As illustrated, the secondary winding of the transformer CT is connected at its ends to the negative and positive input terminals of the amplifier designated terminals 2 and 3. One end of the secondary winding is connected to the non inverting input terminal (+) of the amplifier and to a common connection point shown as a ground connection or node. The opposite end of the secondary winding is coupled to the inverting input terminal (−) and also to a summing junction point designated S. In addition, a feedback resistance element shown as a resistor RF is connected between the summing point S and an output terminal 6 of the operational amplifier 10. Bias voltages are also applied to the operational amplifier 10 via two terminals designated 4 and 7 from a V+ and a V− power supply source not shown. The output voltage $V_{out}$ is taken between the common ground connection and the output terminal 6 of the amplifier.

Figure 2:
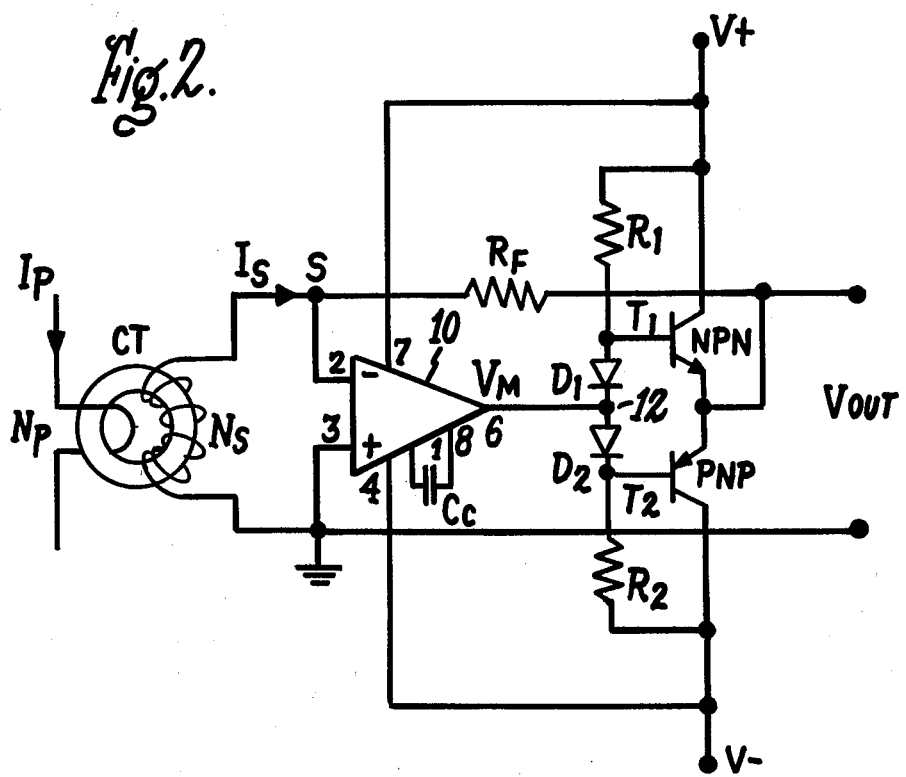
FIG. 2 is a schematic illustration of a second embodiment of the invention similar to FIG. 1, but with the operational amplifier driving a current amplifier to increase the dynamic range of the transformer current.

The output voltage $V_{out}$ is proportional to either the primary current $I_P$ or the secondary current $I_S$. Further, the secondary winding of the current transformer is either virtually short-circuited or at a near short circuit condition. That is the potential difference between the summing point S and ground (terminals 2 and 3 of amplifier 10) is either virtually 0 or relatively small. The operational amplifier 10 has a relatively high open loop gain and in addition the input impedance between its inverting (−) and non inverting (+) input terminals is relatively low. In practicing the invention, a monolithic operational amplifier such as an LM-208A device manufactured by National Semiconductor Company, 2900 Semiconductor Drive, Santa Clara, Calif. 95051 was found to be satisfactory. The pin numbers 1, 2, 3, 4, 6, 7 and 8 shown on the amplifier 10 of FIGS. 1 and 2 are the actual pin numbers assigned to the LM-208A operational amplifier by the manufacturer. It should be pointed out that the LM-208A operational amplifier has a pair of frequency compensation terminals 1 and 8, as shown in FIG. 1. Engineers who employ amplifiers of this type in various circuit designs are well acquainted with the fact that these types of operational amplifiers can be very unstable, having a tendency to oscillate. To compensate for this, an external capacitor is generally connected to the frequency compensation terminals of the amplifier to frequency stabilize the circuit to prevent oscillation. An informative book, which provides detailed descriptions of the operation of various types of operational amplifiers of the types contemplated, inter alia, by the present invention is documented in a book entitled Linear Applications, published by National Semiconductor Corporation dated January 1972. In that book, it is set out that a small capacitor can be chosen for external connection to the amplifier to make the amplifier stable so that it does not oscillate. However, it is not pointed out, as I have discovered, that the use of a capacitive element, such as a capacitor $C_C$ of FIG. 1, connected to terminals 1 and 8 of the amplifier can be employed to alter the phase response of the amplifier when the amplifier is utilized in conjunction with or part of a current transformer. By selecting a capacitor of the proper size and connecting it to the terminals normally used for frequency compensation, the amplifier phase response can be altered to compensate for the phase shift of the current in the current transformer CT to make the output voltage $V_{out}$ from the operational amplifier 10 directly proportional to the current in either the primary or the secondary winding of the transformer. Various types of capacitors may be used for phase compensation of the amplifier, however, it has been found that a small mica capacitor, when connected externally to the amplifier, serves to provide the best compensation. Additionally, the circuit can be fabricated with other types of phase compensation capacitors such as thin film or monolithic capacitors as part of the circuit. In this latter case, an external capacitor may, or may not, be used.

It is also significant to note that amplifier oscillation or frequency instability does not present a major amplifier problem in the present invention. This is due to the fact that the invention contemplates operating with an input line frequency to the current transformer CT in the frequency range of 50 to 60 hertz. At these frequencies, while phase compensation capacitor $C_C$ serves to partially stabilize the operational amplifier, its primary function is to effect an over compensation in the amplifier which is opposite to the phase shift of the current in the transformer. By so making this phase shift compensation, the phase angle between the transformer primary current $I_P$ and the output voltage will be kept very low or to an absolute minimum.

In the operation of the circuit of FIG. 1, the output voltage is calculated as $V_{out} = -(I_P R_F)/N$ where $I_P$ is the primary current, $R_F$ is the value of the feedback resistor and N is the turns ratio of the current transformer CT. The negative sign in the equation comes from the signal inversion in the operational amplifier 10.

The present invention finds its most valuable use in instrumentation systems wherein it is desirable to use integrated or microcircuit technology such as in solid state kilowatt hour metering systems. As such, it is desirable to utilize as small a current transformer as possible. The present invention makes the use of such a transformer possible by the termination of that transformer into an active load such as the operational amplifier 10. A description of such an amplifier depicting a circuit similar to that shown in FIG. 1 is disclosed in detail in U.S. Pat. No. 3,815,013 to Miran Milkovic and assigned to the assignee of the present invention. It has been found however, that the construction of a small core and the materials used in that construction make it difficult to build a miniature transformer having ideal phase response characteristics. Due to this non-ideal characteristic, it has been found that typically, a phase shift of 0.1 degree to about 2 degrees (depending on the core material and construction) occurs in the transformer current. This creates a situation where, without phase shift compensation, the transformer current will lag the amplifier output voltage by a phase angle proportional to the phase shift in the current transformer. It has been found that these phase angles can be economically compensated out by the use of a small capacitor such as capacitor $C_C$ connected across the phase compensation terminals of the amplifier 10. It has been found that capacitor values of 30 to 1000 pico farads will provide the proper phase shift, depending upon the type of operational amplifier used, the power line frequency and the transformer characteristics. In one circuit using the LM-208A operational amplifier, a 500 pico farad capacitor was found to be of the proper size to provide the adequate phase compensation necessary to make the output voltage $V_{out}$ directly proportional to the transformer current.

Reference is now made to FIG. 2, which illustrates the basic circuit of FIG. 1 with the addition of a current amplifier connected to the output terminal 6 of the operational amplifier 10. In various applications contemplated by the present invention, it is sometimes desirable or necessary to increase the output current capability of the operational amplifier. This is accomplished in the present invention by the addition of a current amplifier comprised of two series connected diodes D1 and D2 connected between the output terminals of the operational amplifier and a junction 12 of diodes D1 and D2. The anode of diode D1 is connected to the base input terminal of an NPN transistor T1 whereas, the cathode of diode D2 is connected to the base input terminal of a PNP transistor T2. Transistors T1 and T2 make up a complimentary bipolar emitter follower transistor set for increasing the output drive current of the operational amplifier 10. Additionally, in the current amplifier of FIG. 2, bias voltages are provided to the collectors of transistors T1 and T2 from the V+ and V− power supply terminals. Base bias voltage is also provided to transistors T1 and T2 via two resistors R1 and R2 connected between their respective transistor bases and the power supply terminals V+ and V−. In the particular circuit of FIG. 2, the feedback resistor $R_F$ is connected in a nonconventional fashion between the output (the common connected emitters of transistors T1 and T2) and the inverting input of the operational amplifier 10.

In the quiescent state of operation of the circuit of FIG. 2, both of the diodes D1 and D2 are forward biased due to the values of the resistors R1 and R2 connected between the supply voltages V+ and V−. This causes transistors T1 and T2 to be slightly forward biased. Assume now that current begins to flow through the current transformer CT which causes a first output voltage VM of the operational amplifier 10 to go negative. Under this condition, diode D1 is forward biased turning T1 off and diode D2 is reverse biased allowing the base of transistor T2 to go negative causing the base emitter diode junction of PNP transistor T2 to be more forward biased. This forward biasing causes a large emitter current to flow in transistor T2 which is equal to the secondary current $I_S$ in the current transformer CT and provides a second output voltage ($V_{out}$) substantially proportional to the first voltage $V_M$. At the same time, only a small amount of current of approximately IS/B2 is flowing into the output terminal 6 of the amplifier via the feedback resistor $R_F$, the emitter base diode junction of the transistor T2 and diode D2. B2 is the current gain of transistor T2 and is normally in the order of 50 to 200. This increased current capability now being provided by transistor T2 allows an increase in the dynamic range of the transformer current $I_p$.

The circuit of FIG. 2 operates in the same fashion as just described for transistor T2 when the output voltage $V_M$ of the operational amplifier goes positive. The only difference being, that diode D2 is forward biased to turn off transistor T2 and diode D1 is reverse biased to allow the V+ voltage to be applied via resistor R1 to the base of transistor T1, thus turning that transistor on. In this latter situation, the current IS/B2 is now flowing into the output terminal 6 of amplifier 10 through the base emitter diode junction of transistor T1 via diode D1.

It can now be seen how a capacitor, such as capacitor $C_C$, connected either externally or internally across compensation terminals of a monolith operational amplifier allows alteration of the phase response of the operational amplifier in opposite to the phase shift in the current of transformer CT. By proper selection of the compensating capacitor $C_C$ the phase shift caused in the transformer can be compensated over a wide dynamic range. It is to be emphasized that the present invention is a significant economic improvement over the art as previously described in connection with the aforementioned U.S. Pat. No. 3,815,012 in that only a small single capacitor is needed for phase compensation of an operational amplifier.

It can now be seen how the present invention provides a method of accurately generating an output voltage from the phase compensated operational amplifier proportional to the magnitude of the alternating current applied to the primary winding of the current transformer. This is accomplished by effecting, in the transformer, a shift in the phase of the current applied to the primary winding of the transformer. Next applying the phase shifted current from the secondary winding of the transformer to the phase compensated operational amplifier. Then, in the operational amplifier, shifting the phase of the current applied thereto to compensate for the phase shift of the current in the transformer. This results in generating an output voltage from the operational amplifier, which is directly in phase with, and proportional to the magnitude of the current in the primary winding of the transformer (i.e. the phase angle between $I_S$ and $V_{out}$ is made ideally zero). In addition, if it is desirable to increase the dynamic range of the transformer current, the output voltage from the operational amplifier is current amplified to generate a final output voltage which is in phase with the current in the primary winding of the transformer and which has a magnitude proportional to the current of the secondary winding of the transformer. This latter step is exemplified in FIG. 2 by the utilization of the current amplifier previously described.

Although specific embodiments of the invention have been illustrated and described in detail to illustrate the invention, it is to be understood that the invention may be otherwise embodied without departing from the spirit and scope of the invention which is hereinafter set forth in the claims.

What is claimed is:

1. The combination comprising:
    (a) a current transformer having primary and secondary windings, said transformer effecting a phase shift in the current applied to the primary winding thereof;
    (b) an operational amplifier having a pair of compensation terminals, inverting and non-inverting input terminals at substantially the same potential connected across said secondary winding and an output terminal for providing an output voltage substantially proportional to the current in said transformer;
    (c) a resistance element connected between said inverting input terminal and said output terminal; and
    (d) a capacitive element connected between said pair of compensation terminals for changing the phase response of said operational amplifier to compensate for the phase shift in the current in said transformer to thus minimize the phase angle between the transformer current and the output voltage of said operational amplifier.

2. The combination as set forth in claim 1, wherein said capacitive element alters the phase response of said operational amplifier to cause a phase shift therein which is opposite to the phase shift in the current effected by said transformer.

3. The combination as set forth in claim 2, wherein the size of said capacitive element is chosen to alter the phase response of said operational amplifier by an amount substantially equal to the phase shift effected by said transformer to thus minimize the phase angle between the transformer current and the output voltage of said operational amplifier.

4. The combination as set forth in claim 1, wherein the current in said transformer, prior to compensation in said operational amplifier, lags the output voltage of said operational amplifier.

5. The combination comprising:
   (a) a current transformer having primary and secondary windings, said transformer effecting a phase shift in current applied to the primary winding thereof;
   (b) an operational amplifier having a pair of compensation terminals, inverting and non-inverting input terminals at substantially the same potential connected across the secondary winding of said transformer, and an output terminal for providing a first output voltage substantially proportional to the current in the primary winding of said transformer;
   (c) a capacitive element connected between said pair of compensation terminals for changing the phase response of said operational amplifier to compensate for the phase shift in the current in said transformer to thus minimize the phase angle between the transformer current and the first output voltage of said operational amplifier;
   (d) a current amplifier responsive to the first output voltage of said operational amplifier for providing at an output terminal thereof, a second output voltage substantially proportional to the first output voltage; and
   (e) a resistance element connected between the inverting input terminal of said operational amplifier and the output terminal of said current amplifier, whereby the second output voltage has a current characteristic substantially proportional to the current in the secondary winding of said transformer.

6. The combination as set forth in claim 5, wherein said capacitive element alters the phase response of said operational amplifier to cause a phase shift therein which is opposite to the phase shift in the current effected by said transformer.

7. The combination as set forth in claim 6, wherein the size of said capacitive element is chosen to alter the phase response of said operational amplifier by an amount substantially equal to the phase shift effected by said transformer to thus minimize the phase angle between the transformer current and the output voltage of said operational amplifier.

8. The combination as set forth in claim 5, wherein the current in said transformer, prior to compensation in said operational amplifier, lags the output voltage of said operational amplifier.

9. The combination as set forth in claim 5, wherein said current amplifier comprises a complementary pair of transistors, each having a base, an emitter and a collector, the emitters of said transistors being connected together to form the output terminal of said current amplifier, a pair of series connected diodes, each having a cathode and an anode, said diodes being connected to the output terminal of said amplifier at the series connection of said diodes with the anode of one diode connected to the base of one of said transistors and the cathode of the other of said diodes connected to the base of the other of said transistors, a resistor associated with each of said transistors, each resistor connected between the base and the collector of its associated transistor, and a power source connected to the collector of each of said transistors.

10. A method of accurately generating a voltage proportional to the magnitude of an alternating current applied to a current transformer terminated in a phase shift compensated operational amplifier comprising the steps of:
    (a) effecting, in said transformer, a shift in the phase of the current applied thereto;
    (b) applying the phase shifted current from said transformer to said operational amplifier;
    (c) shifting, in said operational amplifier, the phase of the current applied thereto by an amount determined by the size of a capacitor connected across compensation terminals of said operational amplifier to compensate for the phase shift of the current in said transformer; and
    (d) generating an output voltage from said operational amplifier which is in phase with, and proportional to, magnitude of the current in said transformer.

11. The method as set forth in claim 10, further including the step of current amplifying the output voltage from said operational amplifier to increase the dynamic range of the current in said transformer.

12. A method of accurately generating a voltage proportional to the magnitude of an alternating current applied to the primary winding of a current transformer having its secondary winding terminated in a phase shift compensated operational amplifier comprising the steps of:
    (a) effecting, in said transformer, a shift in the phase of the current applied to the primary winding thereof;
    (b) applying the phase shifted current from the secondary winding of said transformer to said operational amplifier;
    (c) shifting, in said operational amplifier, the phase of the current applied thereto by an amount determined by the size of a capacitor connected across compensation terminals of said operational amplifier to compensate for the phase shift of the current in said transformer;
    (d) generating an output voltage from said operational amplifier which is in phase with and proportional to the magnitude of the current in the primary winding of said transformer; and
    (e) amplifying the output voltage from said operational amplifier to generate a final output voltage which is in phase with the current in the primary winding of said transformer and which has a magnitude proportional to the current in the secondary winding of said transformer.

* * * * *